(12) United States Patent
Wampler et al.

(10) Patent No.: US 7,376,930 B2
(45) Date of Patent: May 20, 2008

(54) METHOD, PROGRAM PRODUCT AND APPARATUS FOR GENERATING ASSIST FEATURES UTILIZING AN IMAGE FIELD MAP

(75) Inventors: Kurt E. Wampler, Sunnyvale, CA (US); Douglas Van Den Broeke, Sunnyvale, CA (US); Uwe Hollerbach, Franklin, MA (US); Xuelong Shi, San Jose, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 581 days.

(21) Appl. No.: 10/878,490

(22) Filed: Jun. 29, 2004

(65) Prior Publication Data

US 2005/0053848 A1   Mar. 10, 2005

Related U.S. Application Data (60) Provisional application No. 60/483,106, filed on Jun. 30, 2003.

(51) Int. Cl.
  *G06F 17/50* (2006.01)
  *G03F 1/00* (2006.01)
(52) U.S. Cl. ............... 716/19; 716/21; 430/5
(58) Field of Classification Search ............ 716/19–21; 382/144; 430/5, 311, 22
See application file for complete search history.

(56) References Cited

U.S. PATENT DOCUMENTS

| | | | |
|---|---|---|---|
| 5,229,230 A | 7/1993 | Kamon | |
| 5,242,770 A | 9/1993 | Chen et al. | |
| 5,682,323 A | 10/1997 | Pasch et al. | |
| 5,707,765 A | 1/1998 | Chen | |
| 5,895,741 A | 4/1999 | Hasegawa et al. | |
| 5,969,441 A | 10/1999 | Loopstra et al. | |
| 6,046,792 A | 4/2000 | Van Der Werf et al. | |
| 6,214,497 B1 | 4/2001 | Stanton | |

(Continued)

FOREIGN PATENT DOCUMENTS

EP    1 202 119 A1    5/2002

(Continued)

OTHER PUBLICATIONS

U.S. Appl. No. 10/756,829.

(Continued)

*Primary Examiner*—Paul Dinh
(74) *Attorney, Agent, or Firm*—McDermott Will & Emery LLP (57) ABSTRACT

Disclosed concepts include a method, program product and apparatus for generating assist features for a pattern to be formed on the surface of a substrate by generating an image field map corresponding to the pattern. Characteristics are extracted from the image field map, and assist features are generated for the pattern in accordance with the characteristics extracted in step. The assist features may be oriented relative to a dominant axis of a contour of the image field map. Also, the assist features may be polygon-shaped and sized to surround the contour or relative to the inside of the contour. Moreover, the assist features may be placed in accordance with extrema identified from the image field map. Utilizing the image field map, a conventional and complex two-dimensional rules-based approach for generating assist feature can be obviated.

16 Claims, 10 Drawing Sheets

U.S. PATENT DOCUMENTS

| | | | |
|---|---|---|---|
| 6,223,139 | B1 | 4/2001 | Wong et al. |
| 6,303,253 | B1 | 10/2001 | Lu |
| 6,355,382 | B1 | 3/2002 | Yasuzato et al. |
| 6,413,684 | B1 | 7/2002 | Stanton |
| 6,421,820 | B1 * | 7/2002 | Mansfield et al. ............ 716/21 |
| 6,519,760 | B2 | 2/2003 | Shi et al. |
| 6,777,141 | B2 | 8/2004 | Pierrat |
| 6,787,271 | B2 | 9/2004 | Cote et al. |
| 6,792,591 | B2 | 9/2004 | Shi et al. |
| 6,807,662 | B2 | 10/2004 | Toublan et al. |
| 2002/0083410 | A1 | 6/2002 | Wu et al. |
| 2002/0152452 | A1 | 10/2002 | Socha |
| 2002/0157081 | A1 | 10/2002 | Shi et al. |
| 2003/0228541 | A1 | 12/2003 | Hsu et al. |
| 2004/0122636 | A1 | 6/2004 | Adam |
| 2004/0142251 | A1 * | 7/2004 | Hsu et al. ...................... 430/5 |
| 2004/0209170 | A1 | 10/2004 | Broeke et al. |

FOREIGN PATENT DOCUMENTS

| | | |
|---|---|---|
| EP | 1 237 046 A2 | 9/2002 |
| EP | 1 439 419 A | 7/2004 |
| EP | 1 439 420 A | 7/2004 |
| WO | WO 02/03140 A1 | 1/2002 |
| WO | WO 03/054626 A1 | 7/2003 |

OTHER PUBLICATIONS

U.S. Appl. No. 10/756,830.

Robert Socha, et al., "Contact Hole Reticle Optimization by Using Interference Mapping Lithography (IML™)," Proceedings of the SPIE, Apr. 14, 2004, pp. 516-534, vol. 5446, No. 1, SPIE.

Douglas Van Den Broeke, et al., "Model-based RET using interface maps, algorithms for random contacts at 65 nm," Solid State Technology, Sep. 2004, pp. 63-64, 66, vol. 47, No. 9, Penwell Corporation.

Douglas Van Den Broeke, et al., "Near 0.3 $k_1$ Full Pitch Range Contact Hole Patterning Using Chromeless Phase Lithography (CPL)," Proceedings of the SPIE, Sep. 9, 2003, pp. 297-308, vol. 5256, SPIE.

Christoph Dolainsky, et al., "Simulation based method for sidelobe suppression," Optical Microlithography XIII, Proceedings of SPIE, 2000, pp. 1156-1162, vol. 4000.

Kyoji Nakajo, et al., "Auxiliary pattern generation to cancel unexpected images at sidelobe overlap regions in attenuated phase-shift masks,", Sep. 1999 SPIE vol. 3748.

Nicolas Bailey Cobb, "Fast Optical and Process Proximity Correction Algorithms for Integrated Circuit Manufacturing," Ph.D. dissertation, Spring 1998, pp. 35-72, University of California at Berkeley.

J.A. Torres, et al., "Contrast-Based Assist Feature Optimization," Optical Microlithography XV, 2002, pp. 179-187, Proceedings of SPIE, vol. 4691, SPIE.

Olivier Toublan, et al., "Fully Automatic Side Lobe Detection and Correction Technique for Attenuated Phase Shift Masks," Optical Microlithography XIV, 2001, pp. 1541-1547, Proccedings of SPIE, vol. 4346, SPIE.

Michael S. Yeung, "Extension of the Hopkins theory of partially coherent imaging to include thin-film interference effects," Optical/Laser Microlithography VI, 1993, pp. 452-463, SPIE, vol. 1927.

Austrian Office Action issued in Austrian Patent Application No. AT 200403795-8, mailed Jul. 12, 2007.

Toublan, O., et al., "Fully Automatic Side Lobe Detection and Correction Technique for Attenuated Phase Shift Masks", Proceedings of the SPIE, 2001, pp. 1541-1547, vol. 4346.

Nakajo, K., et al., "Auxiliary pattern generation to cancel unexpected images at sidelobe overlap regions in attenuated phase-shifts masks", Proceedings of the SPIE—The International Society for Optical Engineering, Sep. 1999, pp. 214-221, vol. 3748, Yokohama Japan.

Dolainsky, C., et al., "Simulation-based Method for Sidelobe Suppression", Proceedings of the SPIE—The International Society for Optical Engineering, 2000, pp. 1156-1162, vol. 4000.

* cited by examiner

METHOD, PROGRAM PRODUCT AND APPARATUS FOR GENERATING ASSIST FEATURES UTILIZING AN IMAGE FIELD MAP

CLAIM OF PRIORITY

This patent application, and any patent(s) issuing therefrom, claim priority from U.S. provisional patent application No. 60/483,106, filed on Jun. 30, 2003, entitled "A Method For Generating Assist Features Utilizing An Image Intensity Map," which is incorporated herein by reference in its entirety.

TECHNICAL FIELD

The technical field relates generally to a method, program product and apparatus for microlithography for generating assist features in accordance with an image field map.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

"Assist features" in masks may be used to improve the image projected onto the resist and ultimately the developed device. Assist features are features that are not intended to appear in the pattern developed in the resist but are provided in the mask to take advantage of diffraction effects so that the developed image more closely resembles the desired circuit pattern. Assist features are generally "sub-resolution" or "deep sub-resolution," meaning that they are smaller in at least one dimension than the smallest feature in the mask that will actually be resolved on the wafer. Assist features may have dimensions defined as fractions of the critical dimension. In other words, because the mask pattern is generally projected with a magnification of less than 1, e.g., ¼ or ⅕, the assist feature on the mask may have a physical dimension larger than the smallest feature on the wafer.

At least two types of assist features may be used. Scattering bars are lines with a sub-resolution width placed on one or both sides of an isolated feature to mimic proximity effects that occur in densely packed regions of a pattern. Serifs are additional areas of various shapes placed at the corners and ends of features, or the corners of rectangular features, to make the end of the line, or the corner, more nearly square or round, as desired (note that in this context assist features commonly referred to as "hammerheads" are regarded as being a form of serif). Further information on the use of scattering bars and serifs can be found in U.S. Pat. Nos. 5,242,770 and 5,707,765, for example, which are incorporated herein by reference.

Of course, one of the goals in integrated circuit fabrication is to faithfully reproduce the original circuit design on the wafer (via the mask), which is improved with the use of assist features. Placement of these assist features generally follows a pre-defined set of rules. Following this method, designers determine how to bias a line, for example, and placement of assist features is determined in accordance with a set of predetermined rules. When creating the set of rules, test masks are exposed to different illumination settings and NA settings, which are repeated. Based on the set of test masks, a set of rules is created for assist feature placement.

However, these rules are generated based on a one-dimensional analysis or a one-and-a-half-dimensional analysis. Rules generated utilizing a one-dimensional analysis are based on an analysis of parallel lines. Rules generated utilizing a one-and-a-half-dimensional analysis take into consideration spacing between two parallel lines, line width and lines in the vicinity of the parallel lines. The one-and-half-dimensional approach is often useful for non-uniform pitch between parallel lines. Obviously, the more factors considered, the more complex the rules become.

The rules-based approach does not adapt itself well to complicated designs where a two-dimensional analysis is preferred. A two-dimensional analysis is based on all of the factors considered in the one-dimensional analysis and the one-and-a-half dimensional analysis, but is further based on a full analysis of the surroundings, i.e., an analysis of the full design layout or any portion thereof. As a result, rules based on a two-dimensional analysis are very difficult to formulate and express, and generally lead to very complicated multi-dimensional matrices. Often designers prefer to use a one-dimensional or one-and-a-half dimensional approach.

There has yet to be created a method for generating assist features by taking into account a full analysis of the surroundings that is less complex and simple to administer, as opposed to a rule-based two-dimensional analysis.

SUMMARY

The disclosed concepts include a method and program product for generating assist features for a pattern to be formed on a surface of a substrate. The steps include generating an image field map corresponding to the pattern, extracting characteristics of the image field map, and generating at least one assist feature for the pattern in accordance with the characteristics extracted. The image field map may correspond to a map showing changes in magnitude of intensity characteristics, interference characteristics, e-field characteristics, or intensity, interference or e-field characteristics that factor a characteristic or a limitation of a lithographic apparatus. Advantageously, a full analysis of the surroundings of the pattern are taken into consideration for generating assist features by utilizing an image field map. This is less complex and simpler to administer, as opposed to a rule-based two-dimensional analysis.

In one unique aspect of the disclosed concepts, characteristics, such as contours, of the image field map are extracted at a predetermined threshold. A dominant axis of the contour is determined, and an assist features is oriented relative to the dominant axis. This may be repeated for other contours at the predetermined threshold, and even other contours at a different predetermined threshold. Generated assist features may be of a predetermined size, or assist features may be sized corresponding to their associated contours.

In another unique aspect of the disclosed concepts, instead of determining dominant axes and orienting assist features accordingly, assist features may be polygon-shaped and sized to closely surround a respective contour. Alternatively, the assist feature may be sized to fit within a respective contour. Even a combination of both polygon-shaped assist features sized to closely surround a respective contour and sized to fit within a respective contour may be utilized.

In yet another unique aspect, extrema characteristics of the image field map may be identified. From each extrema is determined an axial direction of least curvature. Accordingly, an assist feature may be oriented with respect to each extremum in the axial direction. The assist features may be of a predetermined size, or even sized based on a predetermined threshold and corresponding contour extracted from the image field map.

In even another unique aspect, the disclosed concepts include an apparatus for imaging a pattern on a surface of a substrate utilizing a mask. The apparatus includes a radiation system for supplying a projection beam of radiation, an illuminator for receiving the projection beam of radiation and projecting an adjusted beam of radiation on a portion of the mask, and a projection system for imaging a corresponding irradiated portion of the mask onto a target portion of a substrate. The mask is formed utilizing assist features generated in accordance with a non-rule-based two-dimensional analysis of an image field map corresponding to the pattern.

The apparatus comprises even further a computer system configured to generate assist features by generating the image field map corresponding to the pattern, extracting characteristics of the image field map, and generating at least one assist feature for the pattern in accordance with the characteristics extracted. The computer system is configured to generate an assist feature corresponding to a contour of the image field map at a predetermined threshold and the dominant axis of the contour. The computer system is further configured to generate an assist feature corresponding to an extremum of the image field map. These characteristics may be utilized for generating, sizing and placing assist features.

The foregoing and other features, aspects, and advantages of the present disclosure will become more apparent from the following detailed description when taken in conjunction with the accompanying drawings.

DETAILED DESCRIPTION

The inventors have devised novel techniques for determining placement and size of assist features taking into consideration the two-dimensional image field of a pattern to be formed on the surface of a substrate.

Figure 1:
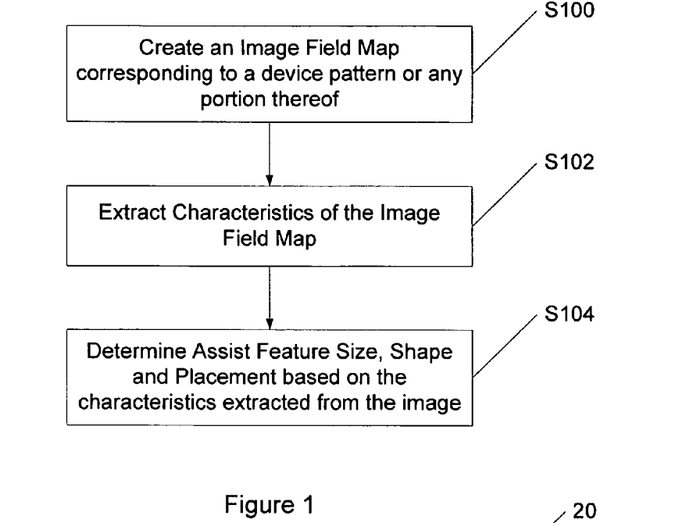
FIG. 1 illustrates an exemplary flow chart for performing the disclosed embodiments.

FIG. 1 is an exemplary flow chart of a method for optimizing placement of assist features on a mask while taking into consideration the two-dimensional image field of an entire pattern, or any portion thereof, to be formed on the surface of a substrate. Hereinafter, the term "pattern" includes an entire pattern or any portion thereof.

In Step 100 (hereinafter, the term Step will be abbreviated as "S"), an image field map is generated corresponding to a pattern or to be formed on the surface of a substrate. The image field map may be generated by a simulator, or captured by illuminating a pattern to be formed on the surface of the substrate. The term "image field map" includes any type of image map that exhibits changes in magnitude and/or sign of intensity characteristics, interference characteristics, e-field characteristics, or even an intensity map taking into account aberrations or any other characteristics or limitations of a lithographic apparatus, which is described later herein. Moreover, the image field map may include any derivation of, or any combination of, these characteristics. For example, an image field map may be generated to show changes in the magnitude of the derivative of intensity. These various types of image field maps are known to those of ordinary skill in the lithography art. For instance, these various types of image field maps are illustrated by:

(1) U.S. patent application Ser. No. 10/756,829, entitled "Method of Optical Proximity Correction Design for Contact Hole Mask," which was filed on Jan. 14, 2004; and (2) U.S. patent application Ser. No. 10/756,830, entitled "Method And Apparatus For Providing Optical Proximity Features To A Reticle Pattern For Deep Sub-Wavelength Optical Lithography," which was also filed on Jan. 14, 2004.

Figure 2:
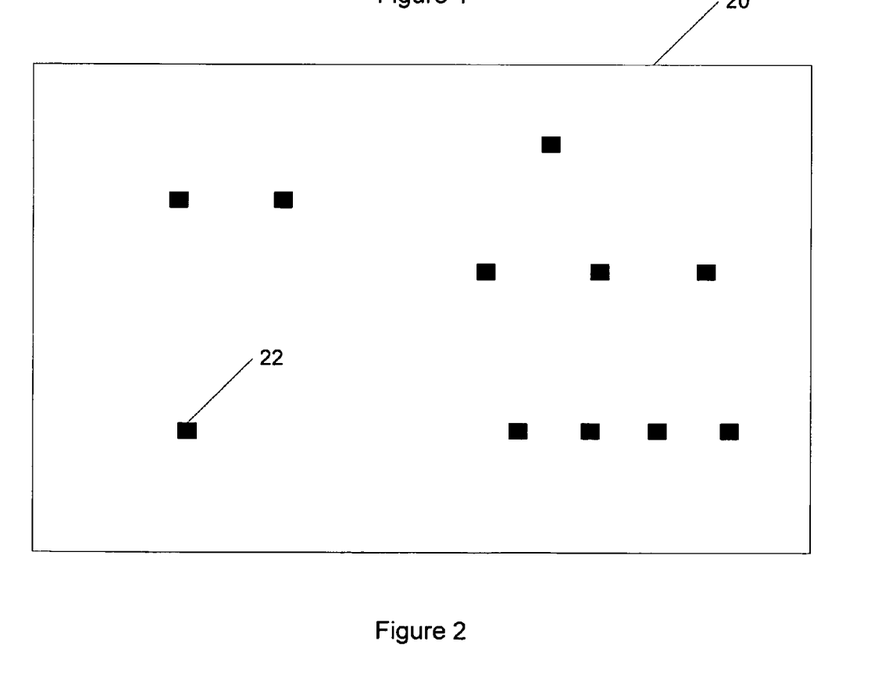
FIG. 2 illustrates an exemplary pattern to be formed on the surface of a substrate.

FIG. 2 illustrates an exemplary contact hole pattern 20 containing a plurality of contact holes 22 from which an image field map may be generated. However, this application shall not be limited to contact hole patterns such as the one illustrated, but includes other patterns, e.g., including line features, line features and contact holes, etc. The contact hole pattern 20 has been chosen for ease of illustration and explanation of the novel concepts disclosed herein.

Figure 3:
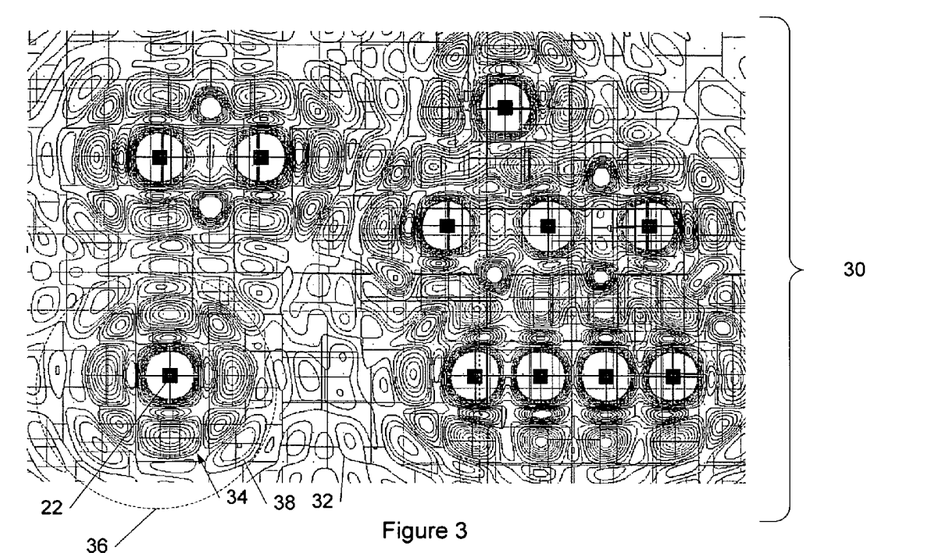
FIG. 3 illustrates an image field map corresponding to the pattern of FIG. 2.

FIG. 3 illustrates an image field map 30 that was generated using the exemplary contact hole pattern 20 of FIG. 2, and corresponds to an image field map that may be generated from S100. The image field map 30 is depicted using contour lines (contour 32) based on the influence and interaction of each of the plurality of contact holes 22. Also, this particular image field map 30 is an intensity map, and contours 34 correspond to certain magnitudes of image intensity at the surface of the substrate.

Each of the embodiments discussed below provide exemplars based on pattern 20 of FIG. 2 and the corresponding image field map 30 of FIG. 3 created from S100 of FIG. 1. A portion 36 of the image field map 30 has been selected for subsequent explanation. This portion 36 will be labeled commonly throughout the drawings. By no way are the embodiments limited to the image field map 30 illustrated, the type of image field map 30, or corresponding pattern 20.

S102 and S104 of FIG. 1 are described in detail in Embodiments 1-5, discussed below. For instance, S102 corresponds to S200 and S202 (FIG. 4) of Embodiment 1, S300 (FIG. 9) of Embodiment 2, S400 (FIG. 14) of Embodiment 3, S500 (FIG. 17) of Embodiment 4, and S600 and S602 (FIG. 18) of Embodiment 5. S104 corresponds to S204 (FIG. 4) of Embodiment 1, S302 (FIG. 9) of Embodiment 2, S402 (FIG. 14) of Embodiment 3, S504 (FIG. 17) of Embodiment 4, and S604-S608 (FIG. 18) of Embodiment 5.

Embodiment 1

Figure 4:
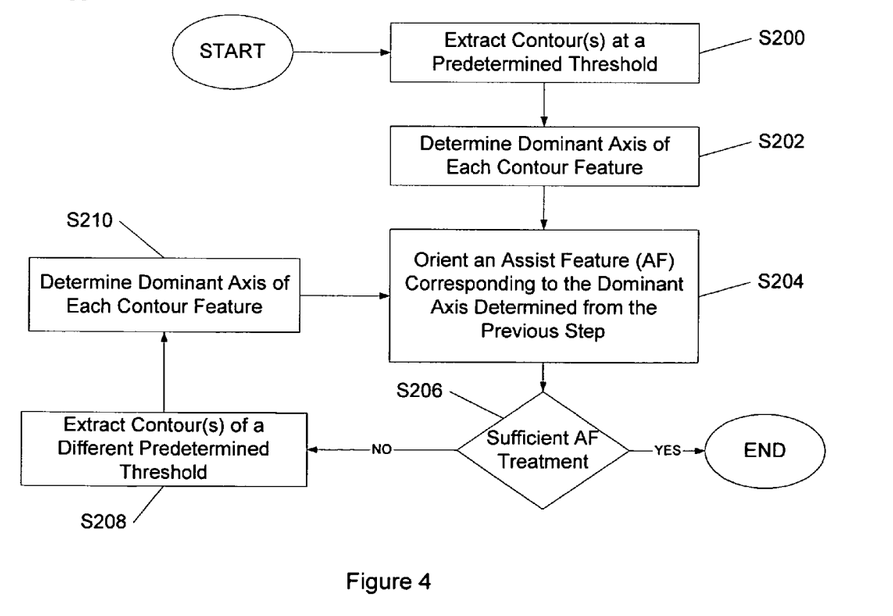
FIG. 4 illustrates an exemplary flow chart in accordance with embodiment 1.
Figure 5:
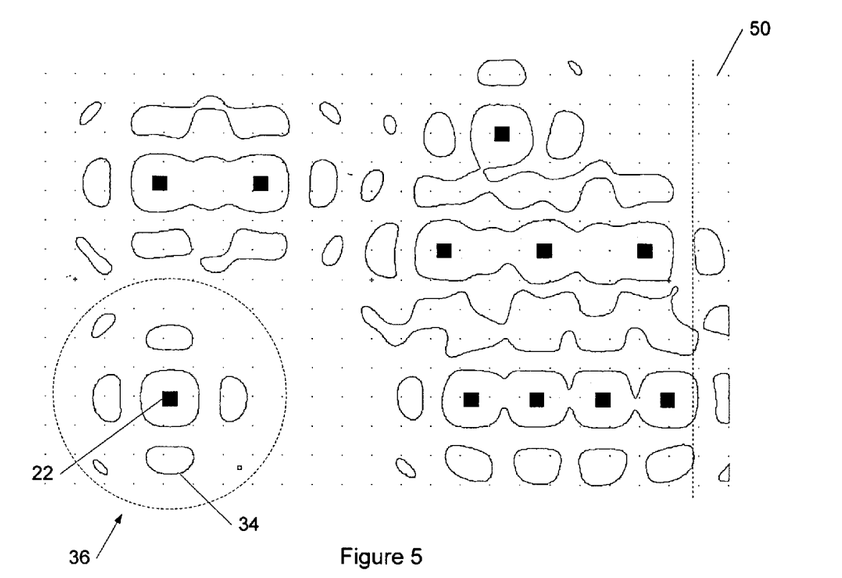
FIG. 5 illustrates a derivation of the image field map of FIG. 3.

Referring back to FIG. 1, in S102, characteristics of the image field map 30 are extracted. Turning to FIG. 4, which illustrates an exemplary flow diagram of the present embodiment, in S200 these characteristics correspond to a contour 34 (a plurality of contours 34) at a predetermined threshold that is extracted. FIG. 5 illustrates a derivation 50 of the image field map 30 in which contour 34 at the predetermined threshold level has been extracted. For ease of illustration, contour 34 is shown in solid.

Figure 6:
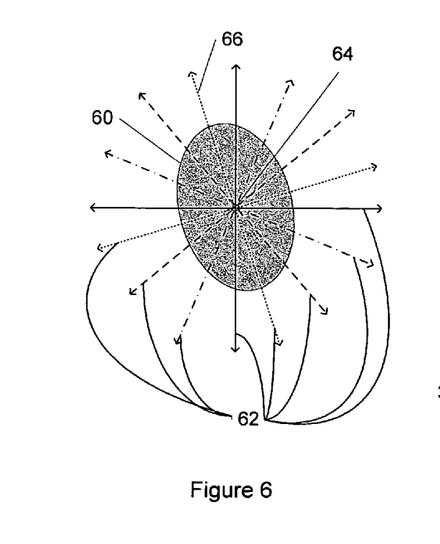
FIG. 6 illustrates an exemplary contour shape for determining a dominant axis.

Referring back to FIG. 4, in S202, a dominant axis of each contour 34 is determined. Techniques for determining a dominant axis of any shape are known to those of ordinary skill in the art. One method entails determining a dominant axis in accordance with a plurality of axes. For example, FIG. 6 illustrates shape 60 and a plurality of axes 62 positioned on or near a centroid 64 of shape 60. Of course, any number of axes 62 may be utilized. Accuracy increases with an increase of the number of axes 62 utilized. However, processing time also increases. The dominant axis corresponds to the axis with the greatest overlap with shape 60. Therefore, in FIG. 6, axis 66 of the plurality of axes 62 corresponds to the dominant axis.

Figure 7:
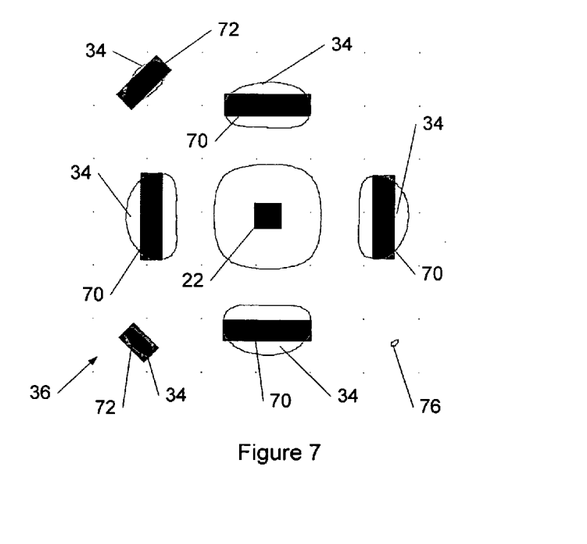
FIG. 7 illustrates a portion of FIG. 5 and assist feature treatment according to embodiment 1.

Referring to FIGS. 4 and 7, in S204, assist features 70 of a predetermined size may be placed corresponding to each contour 34, and oriented with respect to the dominant axis (not shown) for its associated contour 34. Alternatively, assist features 72 may be sized relative to their associated contour 34 in which the assist feature 72 is placed. As before, sized assist features 72 are oriented with respect to the dominant axis (not shown) for its associated contour 34.

Assist features 70 may be sized according to respective contour 34, or assist features 72 may correspond to a predetermined size. Or a predetermined size of assist features 70 or 72 may vary in size relative to the length of the dominant axis (not shown) of the respective contour 34.

Figure 8:
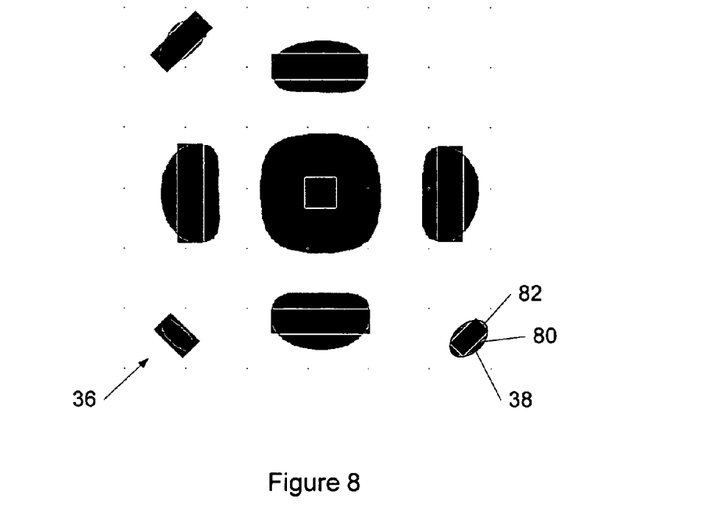
FIG. 8 illustrates a portion of FIG. 5 and further assist feature treatment according to embodiment 1.

Referring again to FIG. 4, in S206, if there has been sufficient assist feature treatment to the pattern, generation of assist features may be halted. Assist feature treatment may be determined by designer inspection, creating a test image, or even by simulation. However, if assist feature treatment is not sufficient, the predetermined threshold may be changed to a different threshold, as in S208. For example, if a contour, such as contour 76 of FIG. 7, is too small to accurately generate an assist feature, a lower or higher predetermined threshold may be selected to expand the area of the contour 76. Referring back to FIG. 2, contour 38 of a different predetermined threshold may be extracted, as in S208. This extracted contour 80 is illustrated by FIG. 8. Accordingly, in S210, a dominant axis of contour 80 is determined.

S204 is repeated for generating the corresponding assist feature 82.

Steps S204-S210 may be repeated until sufficient assist feature treatment is accomplished. Also, Steps S204-S210 may be repeated for a range of thresholds, which may be selected for a sufficient assist feature treatment.

Accordingly, embodiment 1 advantageously generates assist features for the image field map by factoring in characteristics of the entire pattern and avoids complicated computation characteristics of a two-dimensional rule-based approach.

Embodiment 2

Figure 9:
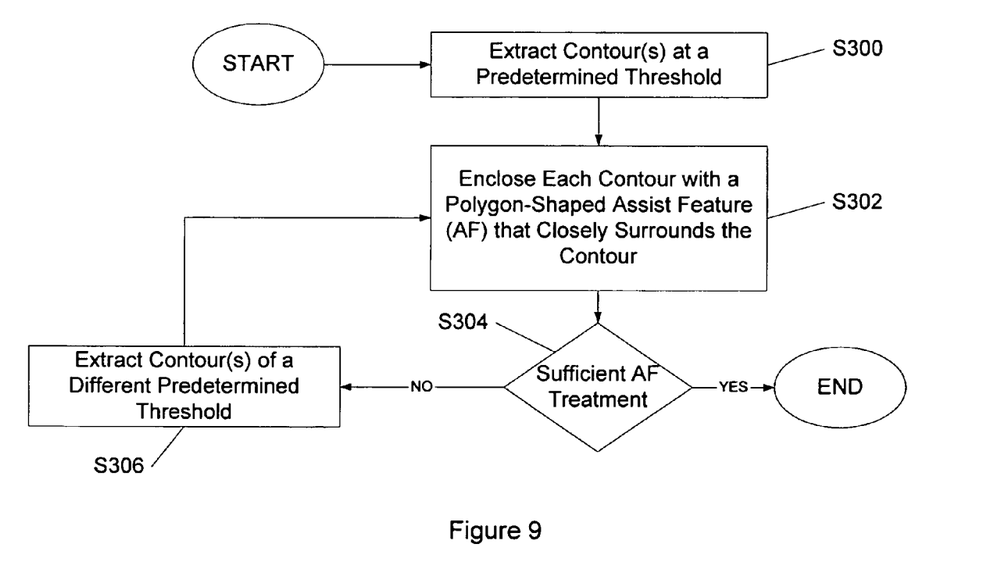
FIG. 9 illustrates an exemplary flow chart in accordance with embodiment 2.

FIG. 9 illustrates an exemplary flow chart for generating assist features according to embodiment 2. S300 corresponds to S200 of FIG. S200. For conciseness, similar descriptions will not be repeated.

Sizing of assist features according to Embodiment 2 differs from Embodiment 1. Instead of determining a dominant axis of contour 34, as in Embodiment 1, polygon-shaped assist features 70-75 are formed corresponding to an area of each of the respective contours 34.

Figure 10:
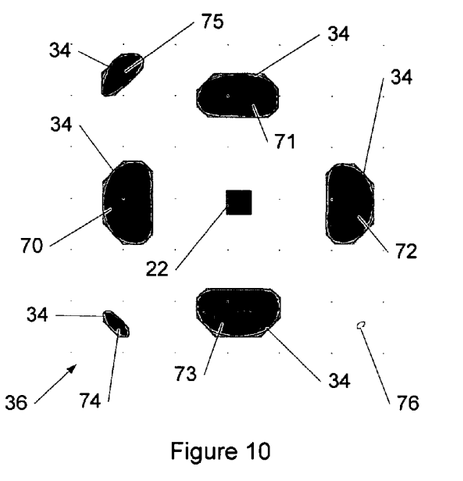
FIG. 10 illustrates a portion of FIG. 5 and assist feature treatment according to embodiment 2.

Embodiment 2, as well as Embodiment 3 discussed below, utilize an octagon-shaped assist feature 70-75 (See FIG. 10). The inventors have found that octagon-shaped assist features 70-75 are preferred because angles at each of the vertices of the octagon-shaped assist features 70-75 are a multiple of 45 degrees. Therefore, geometric and mathematical analysis is easier with angles of multiples of 45 degrees. Of course, any number of sides of a polygon may be used. The greater number of sides of a polygon-shaped assist feature will increasingly match contour 34. However, computation is greatly increased.

Referring back to FIG. 9, in S302 each contour 34 is enclosed by a polygon-shaped assist feature (octagon-shaped assist features 70-75). Therefore, as FIG. 10 illustrates, each assist feature 70-75 is sized to closely surround or enclose its respective contour 34.

Basically, a regular octagon-shaped assist feature (not shown) is positioned to enclose a respective contour 34. Then, a side of the regular octagon-shaped assist feature (not shown) is adjusted until it intersects or nearly intersects an edge of its respective contour 34. This is repeated until all sides of the regular octagon-shaped contour (not shown) have been adjusted, and form an irregular octagon-shaped assist feature, such as those denoted by 70-75. Accordingly, in S302 each octagon-shaped assist feature 70-75 is placed corresponding to its respective contour 34 such that each octagon-shaped assist feature 70-75 closely surrounds its respective contour 34.

Figure 11:
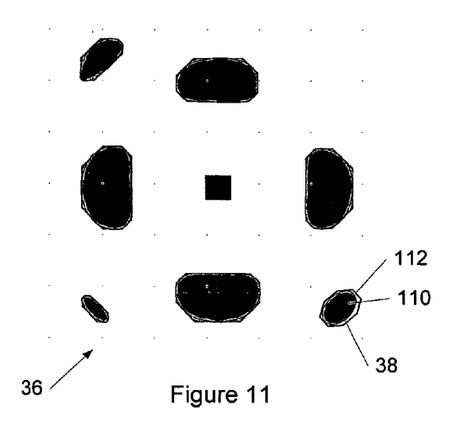
FIG. 11 illustrates a portion of FIG. 5 and further assist feature treatment according to embodiment 2.

S304 corresponds to S206 in FIG. 4. Referring again to FIG. 4, in S304, if there has been sufficient assist feature treatment to the pattern, generation and determination of assist features may be halted. However, if not, the predetermined threshold may be changed to a different threshold, as in S306. For example, if a contour such as contour 76 of FIG. 10 is too small for accurately generating an octagon-shaped assist feature, a lower or higher predetermined threshold may be selected to expand the area of contour 76 for accurately generating an octagon-shaped assist feature. Referring back to FIG. 2, contour 38 of a different predetermined threshold may be extracted, as in S306. This extracted contour 110 is illustrated by FIG. 11. Accordingly, reverting back to S302, an octagon-shaped assist feature 112 is generated corresponding to contour 110.

Steps S302-S306 may be repeated until sufficient assist feature treatment is accomplished. Also, Steps S302-S306 may be repeated for a range of thresholds.

Accordingly, Embodiment 2 advantageously generates polygon-shaped assist features from the image field map that closely resemble its respective contour by factoring in characteristics of the entire pattern and avoids the complicated computation characteristic of a two-dimensional rule-based approach.

Embodiment 3

Figure 12:
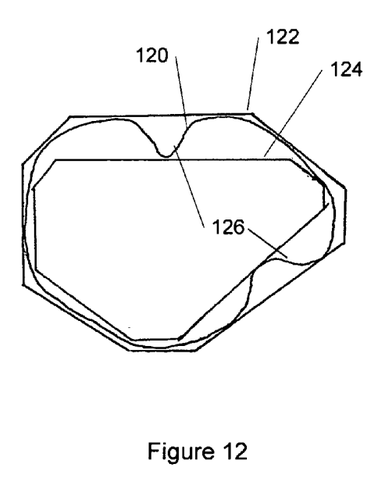
FIG. 12 illustrates an exemplary contour and assist feature treatment according to embodiment 2 and embodiment 3.
Figure 13:
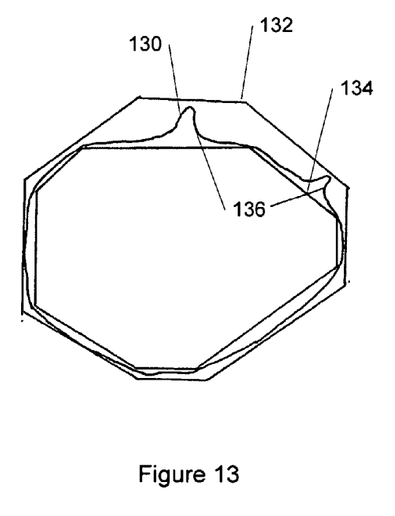
FIG. 13 illustrates another exemplary contour and assist feature treatment according to embodiment 2 and embodiment 3.

Embodiment 3 utilizes polygon-shaped assist features similar to that of Embodiment 2. However, instead of enclosing a contour with a polygon-shaped assist feature, a polygon-shaped assist feature is formed within the contour. Even further, the polygon-shaped assist feature may be inscribed within the contour (vertices intersect the contour). FIGS. 12 and 13 illustrate the characteristics of each method.

FIG. 12 illustrates an exemplary contour 120, a polygon-shaped assist feature 122 formed surrounding contour 120 in accordance with Embodiment 2, and a polygon-shaped assist feature 124 formed inside contour 120 in accordance with embodiment 3. Because of inner protrusions 126 of contour 120, polygon-shaped assist feature 122 formed surrounding contour 120 more closely matches its shape, as opposed to polygon-shaped assist feature 124 formed inside the contour 120. Conversely, FIG. 13 illustrates an exemplary contour 130, polygon-shaped assist feature 132 formed surrounding contour 130 in accordance with Embodiment 2, and polygon-shaped assist feature 134 formed inside the contour 130 in accordance with Embodiment 3. Because of the outer protrusions 136 of contour 130, polygon-shaped assist feature 134 formed within contour 130 more closely matches the shape of contour 130, as opposed to polygon-shaped assist feature 132 formed surrounding contour 130.

Figure 14:
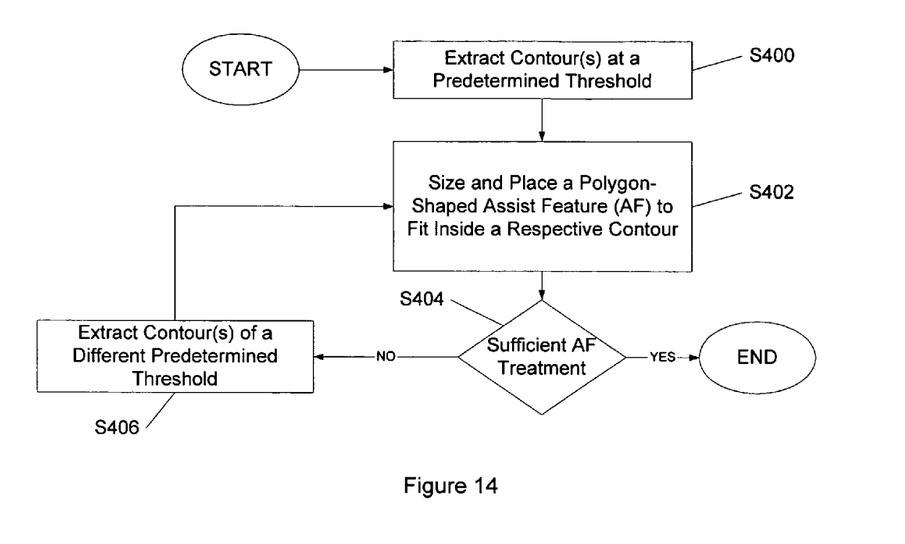
FIG. 14 illustrates an exemplary flow chart in accordance with embodiment 3.

FIG. 14 illustrates an exemplary flow chart for generating assist features according to embodiment 3. S400 corresponds to S300 of FIG. 9. For conciseness, similar descriptions will not be repeated.

Figure 15:
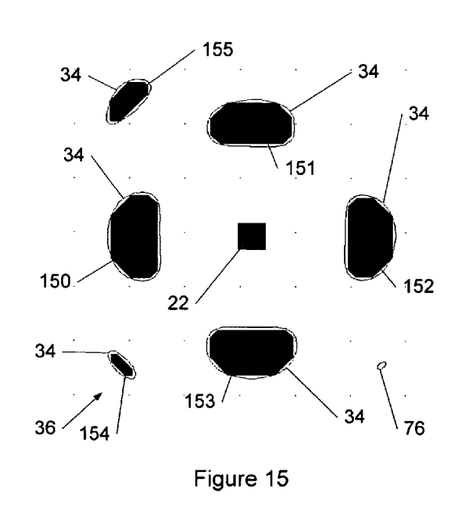
FIG. 15 illustrates a portion of FIG. 5 and assist feature treatment according to embodiment 3.

In S402, each octagon-shaped assist feature 150-155 (FIG. 15) is formed within its respective contour 34. Therefore, as FIG. 15 illustrates, each assist feature 150-155 is sized closely corresponding to an area of its respective contour 34.

Basically, a regular octagon-shaped assist feature (not shown) is positioned relative to a respective contour 34. An edge of the regular octagon-shaped assist feature (not shown) is adjusted until the ends of the edge intersect or nearly intersect an edge of its respective contour 34. This is repeated until all sides of the regular octagon-shaped contour (not shown) have been adjusted, and form an irregular octagon-shaped assist feature 150-155 within its respective contour. If all vertices of an octagon-shaped assist feature 150-155 touch a respective contour 34, the octagon-shaped assist feature 150-155 would be inscribed.

Figure 16:
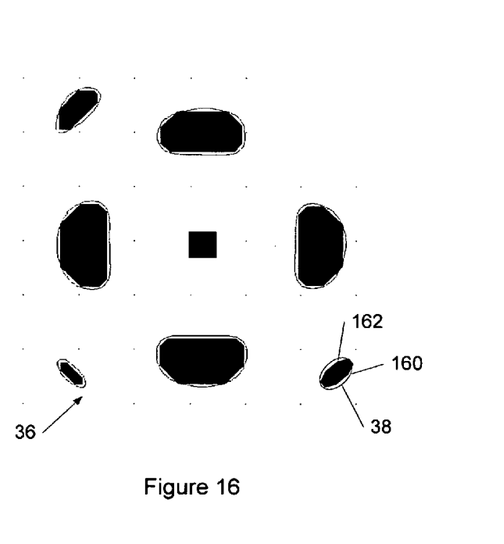
FIG. 16 illustrates a portion of FIG. 5 and further assist feature treatment according to embodiment 3.

Referring again to FIG. 14, in S404, if there has been sufficient assist feature treatment to the pattern, generation and determination of assist features may be halted. However, if not, the predetermined threshold may be changed to a different threshold, as in S406. For example, if a contour, such as contour 76 of FIG. 15, is too small for accurately generating an octagon-shaped assist feature, a lower or higher predetermined threshold may be selected to expand the area of the contour 76. Referring back to FIG. 2, contour 38 of a different predetermined threshold may be extracted, as in S406. This extracted contour 160 is illustrated by FIG. 16. Accordingly, reverting back to S402, an octagon-shaped assist feature 162 is generated corresponding to contour 160.

Steps S402-S406 may be repeated until sufficient assist feature treatment is accomplished. Also, Steps S402-S406 may be repeated for a range of predetermined thresholds.

Accordingly, Embodiment 3 advantageously generates polygon-shaped assist features from the image field map that closely resemble its respective contour by factoring in characteristics of the entire pattern and avoid the complicated computation characteristic of a two-dimensional rule-based approach.

Embodiment 4

Contour 34 may be better suited for a polygon-shaped assist feature surrounding its respective contour, while another polygon-shaped assist feature may be better suited for being formed inside its respective contour. This distinction was described in connection with FIGS. 12 and 13. Embodiment 4 is a combination of embodiments 2 and 3 whereby it is determined for each contour whether a polygon-shaped assist feature is to be formed surrounding the contour or inside the contour.

Figure 17:
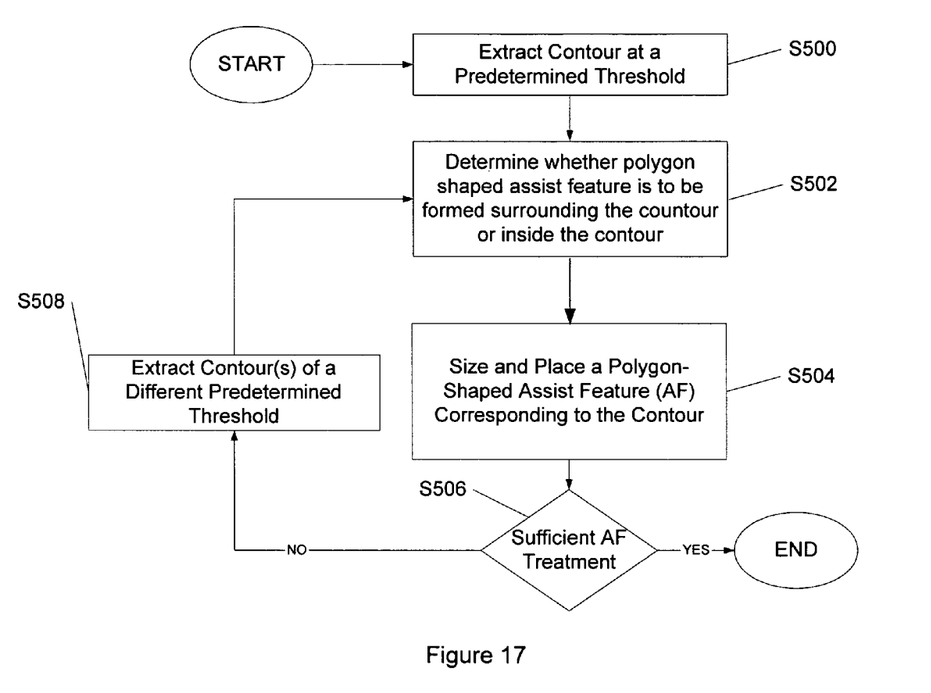
FIG. 17 illustrates an exemplary flow chart in accordance with embodiment 4.

FIG. 17 illustrates an exemplary flow chart of embodiment 4. S500 corresponds to S400 of FIG. 14, and therefore the description will not be repeated for the sake of conciseness. In S502, it is determined whether a polygon-shaped assist feature is to be formed surrounding the contour or inside the contour extracted in S400. This may be accomplished by analyzing the contour for any intrusions 126, as illustrated by FIG. 12, or any protrusions 136, as is illustrated by FIG. 13. If the contour contains both intrusions 126 and protrusions 136, the analysis may determine the dominant characteristic. Based on this analysis, it may be determined whether a polygon-shaped assist feature is to be formed surrounding the contour or inside the contour extracted in S400.

In S504, a polygon-shaped assisted feature may be sized and placed corresponding to the contour. Steps S506 and S508 correspond to Steps S404 and S406, respectively, and similar descriptions will not be repeated for the sake of conciseness. However, after extracting a contour at a different predetermined threshold in S508, in S502 the newly extracted contour is analyzed to determine whether a polygon-shaped assist feature is to be formed surrounding the contour or inside the contour extracted in S508.

Accordingly, embodiment 4 advantageously generates polygon-shaped assist features from the image field map that closely resembles its respective contour by factoring in characteristics of the entire pattern and avoids complicated the computation characteristic of a two-dimensional rule-based approach.

Embodiment 5

Common to Embodiments 1-4 is an iterative step in which the predetermined threshold is adjusted to accurately generate assist features for contours corresponding to a plurality of thresholds. Embodiment 5 overcomes the iterative routine and generates assist features according to extrema identified in the image field map 30 of FIG. 3. Extrema may include maxima, minima or any combination thereof. Referring to FIG. 3, each extremum corresponds to either a local maximum point or a local minimum point within the image field map.

Figure 18:
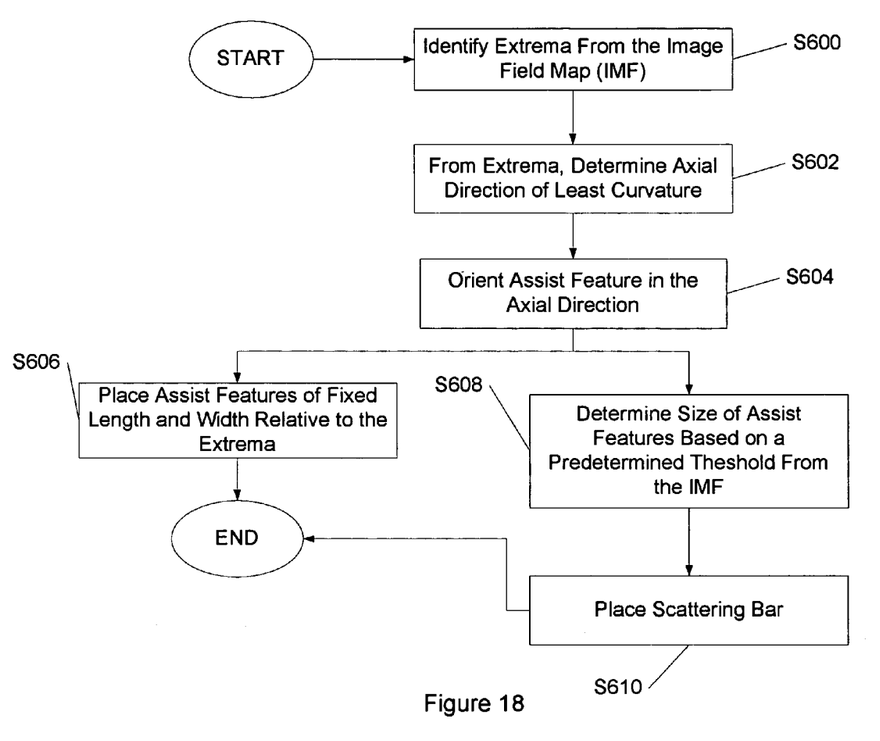
FIG. 18 illustrates an exemplary flow chart in accordance with embodiment 5.
Figure 19:
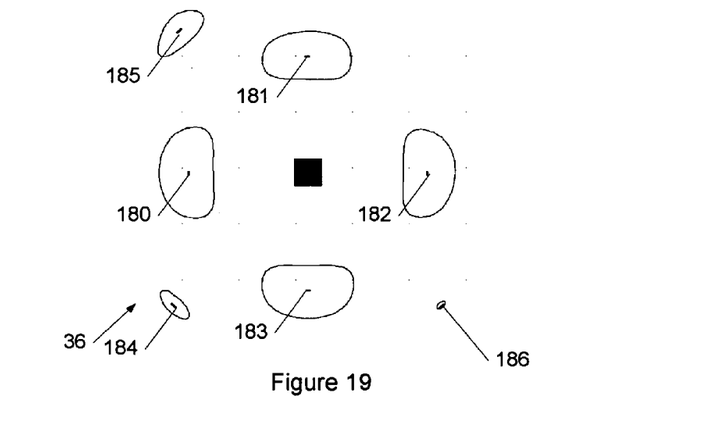
FIG. 19 illustrates a portion of FIG. 5 including extrema according to embodiment 5.

FIG. 18 illustrates an exemplary flow chart for generating assist features according to embodiment 5. In S600, extrema from the image field map 30 are identified. The mathematical (or geometric) analysis for identifying extrema in the image field map 30 is known to one of ordinary skill in the art. For example, FIG. 19 illustrates portion 36 in which local minima 180-186 have been identified. It is noted that portion 36 includes both minima and maxima. However, for ease of illustration and explanation, only minima 180-186 have been illustrated.

In S602, an axial direction of least curvature is determined for each extremum. The axial direction of least curvature corresponds to the direction in which there is the least amount of slope as compared to any other direction for each extremum. The mathematical (or geometric) analysis for determining the axial direction of least curvature is known to one of ordinary skill in the art.

Figure 20:
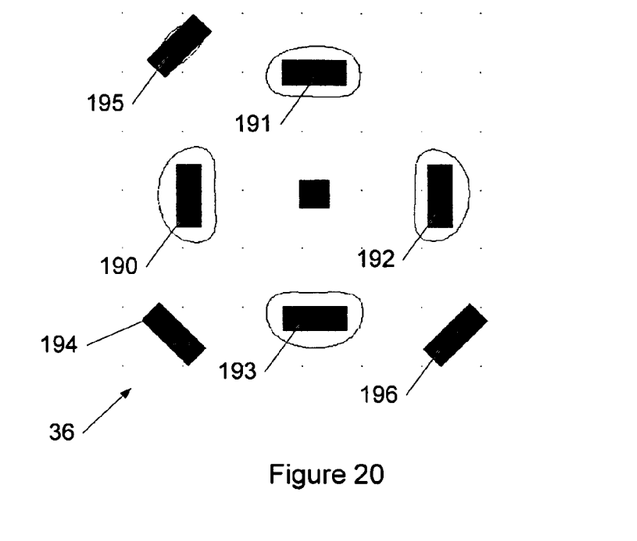
FIG. 20 illustrates a portion of FIG. 5 and assist feature treatment according to embodiment 5.

In S604, assist features are oriented corresponding to each extremum in the axial direction. Either the assist feature may be of a predetermined size, or sized relative to a contour at a predetermined threshold. In S606, assist features of a predetermined size may be placed relative to each extremum 180-186. The result of S606 is illustrated by FIG. 20, which illustrates portion 36 and assist features 190-196 of predetermined size placed relative to extrema 180-186, respectively. Preferably, the centroids of assist features 190-196 would be aligned with extrema 180-186, respectively.

Figure 21:
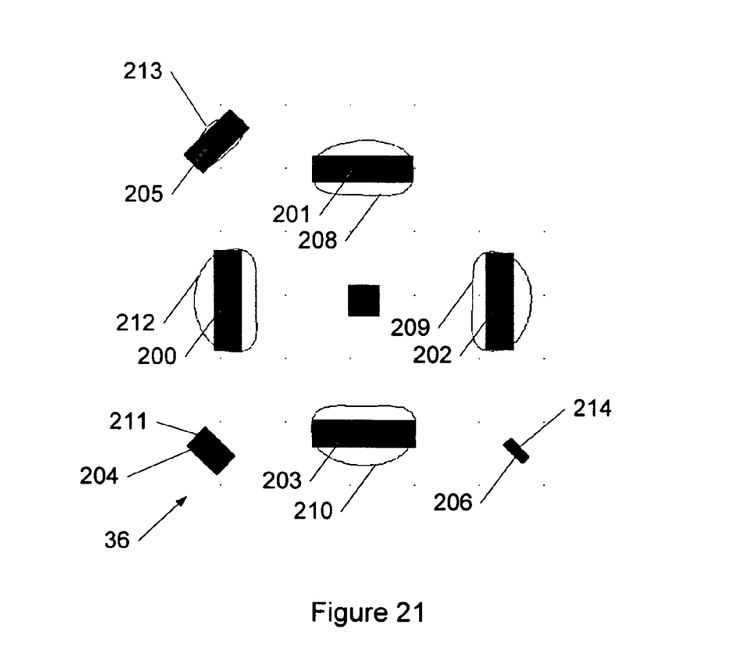
FIG. 21 illustrates a portion of FIG. 5 and assist feature treatment according to embodiment 5.

Alternatively, in Steps S608, length and width of assist features 200-206 (FIG. 21), respectively, may be determined based on a predetermined threshold from the image field map 30. Specifically, in S608, lengths of assist features 200-206 are determined based on the length of a respective contour 209-214 at the predetermined threshold. Similarly, in S608, widths of the assist features 200-206 may be determined based on a width of a respective contour 209-214 at the predetermined threshold. However, as illustrated, widths of assist features are predetermined.

Accordingly, embodiment 5 advantageously generates assist features from the image field by factoring characteristics of the entire pattern and avoids the complicated computation characteristic of a two-dimensional rule-based approach.

In embodiments 1-5, assist features of varying phases may be determined in accordance with extrema or contours identified. For example, for minima, a 180° phase-shifted, 100% transmittance assist feature may be placed. And, for maxima, a 0° phase-shifted, 100% transmittance, assist feature may be placed.

Figure 22:
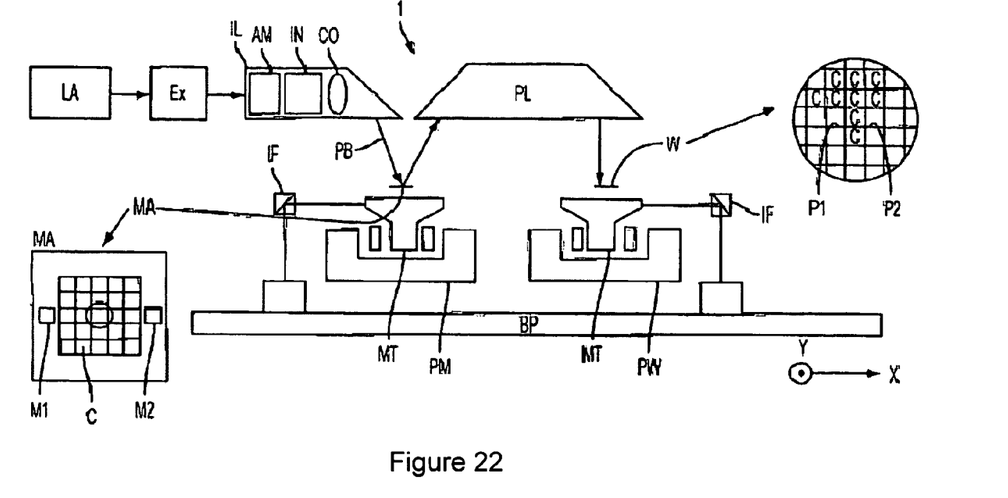
FIG. 22 schematically depicts an exemplary lithographic projection apparatus suitable for use with a mask designed with the aid of the disclosed concepts.

FIG. 22 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation.

This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 22 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of generating assist features for a pattern to be formed on a surface of a substrate, the steps comprising:

(a) generating an image field map corresponding to the pattern;
(b) extracting characteristics of a contour at a predetermined threshold of the image field map; and
(c) determining a dominant axis of the contour;
(d) generating at least one assist feature for the pattern in accordance with the characteristics extracted in step (b);
(e) orienting an assist feature in accordance with the dominant axis.

2. The method of generating assist features according to claim 1, wherein the image field map corresponds to a map showing changes in magnitude of intensity characteristics, interference characteristics, e-field characteristics, or intensity, interference or e-field characteristics that factor a characteristic or a limitation of a lithographic apparatus for forming the pattern over the surface of the substrate.

3. The method of generating assist features according to claim 1, wherein in step (b), characteristics at the predetermined threshold corresponds to a plurality of contours of the image field map.

4. The method of generating assist features according to claim 1, further comprising the steps of:
   (i) analyzing a different contour at a different predetermined threshold;
   (ii) determining a dominant axis of the contour and of the different contour; and
   (iii) orienting an assist feature in accordance with the dominant axis of the contour and another assist feature in accordance with the dominant axis of the different contour.

5. The method of generating assist features according to claim 1, further comprising the step of determining the dominant axis of the contour in accordance with one axis of a plurality of axes.

6. The method of generating assist features according to claim 5, further comprising the step of positioning an origin of the plurality of axes on or near a centroid of the contour.

7. The method of generating assist features according to claim 1, wherein the assist feature is of a predetermined size.

8. The method of generating assist features according to claim 1, further comprising the step of determining a length or width of the assist feature in accordance with the contour.

9. A computer program product, comprising executable code stored in at least one machine readable memory, wherein execution of the code by at least one programmable computer causes the at least one programmable computer to perform a sequence of steps for generating assist features for a pattern to be formed on a surface of a substrate, the steps comprising:

(a) generating an image field map corresponding to the pattern;
(b) extracting characteristics of a contour at a predetermined threshold of the image field map; and
(c) determining a dominant axis of the contour;
(d) generating at least one assist feature for the pattern in accordance with the characteristics extracted in step (b);
(e) orienting an assist feature in accordance with the dominant axis.

10. The computer program product according to claim 9, wherein the image field map corresponds to a map showing changes in magnitude of intensity characteristics, interference characteristics, e-field characteristics, or intensity, interference or e-field characteristics that factor a characteristic or a limitation of a lithographic apparatus for forming the pattern over the surface of the substrate.

11. The computer program product according to claim 9, wherein in step (b), characteristics at the predetermined threshold corresponds to a plurality of contours of the image field map.

12. The computer program product according to claim 9, further comprising the steps of:
   (i) analyzing a different contour at a different predetermined threshold;
   (ii) determining a dominant axis of the contour and of the different contour; and
   (iii) orienting an assist feature in accordance with the dominant axis of the contour and another assist feature in accordance with the dominant axis of the different contour.

13. The computer program product according to claim 9, further comprising the step of determining the dominant axis of the contour in accordance with one axis of a plurality of axes.

14. The computer program product according to claim 13, further comprising the step of positioning an origin of the plurality of axes on or near a centroid of the contour.

15. The computer program product according to claim 9, wherein the assist feature is of a predetermined size.

16. The computer program product according to claim 9, further comprising the step of determining a length or width of the assist feature in accordance with the contour.

* * * * *